US012298493B2

United States Patent
Ishii et al.

(10) Patent No.: US 12,298,493 B2
(45) Date of Patent: May 13, 2025

(54) MEMS DISPLAY DEVICE WITH AN ETCH-STOP-LAYER

(71) Applicant: IGNITE, Inc., Tokyo (JP)

(72) Inventors: Fusao Ishii, Pittsburgh, PA (US); Victor Stone, Pittsburgh, PA (US); Toshitaka Torikai, Sagamihara (JP)

(73) Assignee: IGNITE, Inc., Tokyo (JP)

(*) Notice: Subject to any disclaimer, the term of this patent is extended or adjusted under 35 U.S.C. 154(b) by 935 days.

(21) Appl. No.: 17/257,495

(22) PCT Filed: Jul. 3, 2019

(86) PCT No.: PCT/US2019/040543
§ 371 (c)(1),
(2) Date: Dec. 31, 2020

(87) PCT Pub. No.: WO2020/010225
PCT Pub. Date: Jan. 9, 2020

(65) Prior Publication Data
US 2021/0364781 A1  Nov. 25, 2021

Related U.S. Application Data

(60) Provisional application No. 62/694,008, filed on Jul. 4, 2018.

(51) Int. Cl.
*B81C 1/00* (2006.01)
*B81B 7/02* (2006.01)
*G02B 26/08* (2006.01)

(52) U.S. Cl.
CPC ............ *G02B 26/0841* (2013.01); *B81B 7/02* (2013.01); *B81C 1/00801* (2013.01);
(Continued)

(58) Field of Classification Search
CPC .... G02B 26/0841; G02B 26/085; B81B 7/02; B81B 7/04; B81B 2201/042
See application file for complete search history.

(56) References Cited

U.S. PATENT DOCUMENTS 6,917,459 B2    7/2005  Nikkel et al.
2003/0207032 A1  11/2003  Ahn et al.
(Continued)

FOREIGN PATENT DOCUMENTS

WO   WO-2018004562 A1 *  1/2018

OTHER PUBLICATIONS

Bakke et al., "Etch Stop Materials for Release by Vapor HF Etching", Micromechanics Europe 122 (Jan. 29, 2005): 68, 4 pgs.

*Primary Examiner* — Walter H Swanson
*Assistant Examiner* — Jacob T Nelson
(74) *Attorney, Agent, or Firm* — Young Basile Hanlon & MacFarlane, P.C.

(57) ABSTRACT

A Micro-Electro-Mechanical Systems (MEMS) device includes a substrate, an electronic circuit on the substrate, an electrode electrically connected to the electronic circuit, a movable element that is controlled by applying a voltage between the electrode and the movable element, an insulating layer between the electrode and the electronic circuit, and an etch stop layer. The insulating layer has a via electrically connecting the electrode and the electronic circuit, and the etch stop layer is made of at least one of Aluminum nitride or Aluminum oxide. The etch stop layer may cover the electrode and the electronic circuit, or the electrode may be mounted on the etch stop layer, electrically connected to the electronic circuit through the etch stop layer by the via.

20 Claims, 6 Drawing Sheets

(52) U.S. Cl.
CPC ..... *B81B 2201/042* (2013.01); *B81B 2203/04* (2013.01); *B81C 2201/0132* (2013.01); *B81C 2201/014* (2013.01)

(56) References Cited

U.S. PATENT DOCUMENTS

| | | | |
|---|---|---|---|
| 2005/0067633 A1* | 3/2005 | Mushika | H01L 21/76846 257/E21.582 |
| 2005/0242687 A1 | 11/2005 | Kawakubo et al. | |
| 2008/0218844 A1* | 9/2008 | Ishii | B81C 1/00801 257/E21.597 |
| 2008/0285112 A1* | 11/2008 | Ishii | G02B 26/0841 359/290 |
| 2010/0033800 A1* | 2/2010 | Ishii | G09G 3/2011 359/295 |
| 2010/0053726 A1* | 3/2010 | Shirai | G02B 26/0841 359/321 |
| 2012/0248478 A1 | 10/2012 | Lee et al. | |
| 2012/0326313 A1* | 12/2012 | Uzoh | H01L 23/53209 438/622 |
| 2014/0264644 A1* | 9/2014 | Wu | B81B 3/0021 438/52 |
| 2014/0306771 A1 | 10/2014 | Malpass | |
| 2016/0216509 A1* | 7/2016 | Wakabayashi | G02B 26/0841 |
| 2020/0239303 A1* | 7/2020 | Rudloff | B81C 1/00801 |

* cited by examiner

MEMS DISPLAY DEVICE WITH AN ETCH-STOP-LAYER

CROSS-REFERENCE TO RELATED APPLICATION

This application claims priority to and the benefit of U.S. Provisional Application Patent Ser. No. 62/694,008, filed Jul. 4, 2018, the entire disclosure of which is hereby incorporated by reference.

TECHNICAL FIELD

This disclosure relates to processes for manufacturing micro-electro-mechanical systems (MEMS). More particularly, this disclosure relates to manufacturing processes in producing MEMS devices with a strong protection layer to resist attacks by etchants during release etching to remove a sacrificial layer.

BACKGROUND

A critical process in MEMS manufacturing is the removal of a sacrificial layer. When a sacrificial layer is removed by etching, structures of the MEMS, such as a complementary metal-oxide-semiconductor (CMOS) electronic circuit, may be damaged by the etchant.

SUMMARY

An aspect of this disclosure is to provide a strong protective layer for a MEMS device that can survive etching a sacrificial layer using a vapor etchant such as hydrofluoric acid (HF or VHF).

A MEMS device according to this disclosure can include a substrate, an electronic circuit on the substrate, an electrode electrically connected to the electronic circuit, a movable element that is controlled by applying a voltage to between the electrode and the movable element, an insulating layer between the electrode and the electronic circuit, wherein the insulating layer has a via electrically connecting the electrode and the electronic circuit, and an etch stop layer on the insulating layer, wherein the etch stop layer is made of at least one of Aluminum nitride or Aluminum oxide. The etch stop layer may cover the electrode and the electronic circuit, or the electrode may be mounted on the etch stop layer, electrically connected to the electronic circuit through the etch stop layer by the via.

A method for manufacturing a MEMS device on a substrate according to this disclosure can include forming an electronic circuit on the substrate, forming an insulating layer on the substrate, forming a via comprising a through-hole extending through the insulating layer and filled with an electrically-conductive material that is electrically connected to the electronic circuit, forming an electrode connected to the via on the insulating layer, forming an etch stop layer on the insulating layer, the etch stop layer made of at least one of Aluminum nitride or Aluminum oxide, forming a vertical hinge connected to the electrode, forming a sacrificial layer on the insulating layer, forming a movable element connected to the hinge, and removing the sacrificial layer by hydrofluoric acid vapor. The etch stop layer may be formed after forming the electrode such that the etch stop layer is between the movable element and the electrode. Alternatively, the electrode may be formed after forming the etch stop layer such that the electrode is formed on the etch stop layer.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity. Further, like reference numbers refer to like elements unless otherwise noted.

DETAILED DESCRIPTION

Figure 1:
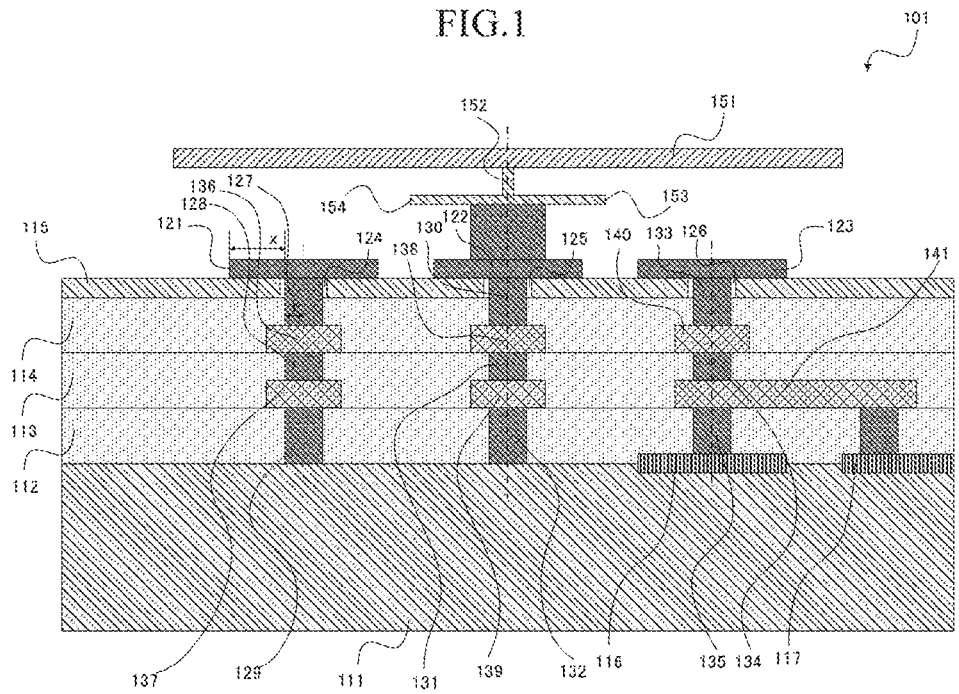
FIG. 1 is a cross-sectional diagram of a MEMS device that can be used in a display device according to a first embodiment.
Figure 2:
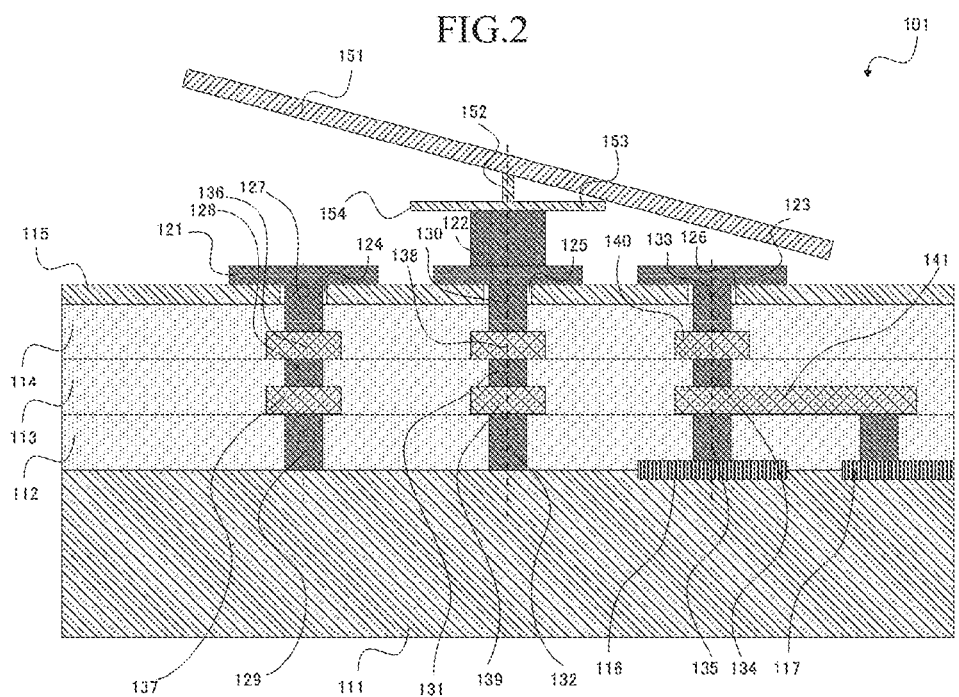
FIG. 2 is a cross-sectional diagram when a mirror of the MEMS device in FIG. 1 is deflected to an ON state.

FIGS. 1 and 2 show a cross-sectional view of a MEMS device 101 in a first embodiment of this disclosure. These figures and others herein are used to describe a single movable element of a MEMS device according to this disclosure. However, the MEMS devices described herein may include multiple movable elements. Where the movable element is a mirror such that the MEMS device is used in a display, for example, the MEMS device may include approximately 2 million mirrors in some implementations.

The MEMS device 101 includes a substrate 111. At least one electronic circuit is formed on the substrate 111, which in this example is one or more transistors 116, 117. Inter-layer dielectrics 112, 113, 114 are formed on the substrate 111. Namely, the inter-layer dielectric 112 is formed on the substrate 111 and portions of the electronic circuits, here the transistors 116, 117. The inter-layer dielectric 113 is formed on the inter-layer dielectric 112, and the inter-layer dielectric 114 is formed on the inter-layer dielectric 113. More or fewer inter-layer dielectrics may be incorporated. An inter-layer dielectric may also be referred to herein as an insulating layer. An etch stop layer 115 formed on the (e.g., top) inter-layer dielectric 114 that is layered furthest from the substrate.

The MEMS device 101 has metal layers 136, 137, 138, 139, 140, 141 and electrodes 121, 122, 123 for electrical wiring between the inter-layer dielectrics 112, 113, 114. Also, the MEMS device 101 has vias 127, 128, 129, 130, 131, 131, 132, 133, 134, 135 connecting electrical wirings and electrodes. More generally, the MEMS device 101 can include one or more electrodes mounted on the etch stop layer 115 for electrical connection with the one or more electronic circuits of the MEMS device 101 through metal layers and vias insulated using the inter-layer dielectrics. The number of electrodes, metal layers, and vias of a MEMS device according to the teachings herein can vary based on the electronic circuits within the MEMS device 101 and their arrangements therein.

As shown in FIG. 1, the via 127 provides a conductive path through the inter-layer dielectric 114 from the electrode 121, which is formed on the etch stop layer 115, to the metal layer 136, which is formed on the inter-layer dielectric 114. The via 128 provides a conductive path through the inter-layer dielectric 113 from the metal layer 136, which is formed on the inter-layer dielectric 114, to the metal layer 137, which is formed on the inter-layer dielectric 112. The via 129 provides a conductive path through the inter-layer dielectric 112 from the metal layer 137, which is formed on the inter-layer dielectric 112, to the substrate 111. Through the vias 127, 128, 129 and the metal layers 136, 137, the electrode 121 may be electrically wired or connected to electronic circuits with contacts on the substrate 111, the inter-layer dielectric 113, and the inter-layer dielectric 114.

In a similar manner, the via 130 provides a conductive path through the inter-layer dielectric 114 from the electrode 122, which is formed on the etch stop layer 115, to the metal layer 138, which is formed on the inter-layer dielectric 114. The via 131 provides a conductive path through the inter-layer dielectric 113 from the metal layer 138, which is formed on the inter-layer dielectric 114, to the metal layer 139, which is formed on the inter-layer dielectric 112. The via 132 provides a conductive path through the inter-layer dielectric 112 from the metal layer 139, which is formed on the inter-layer dielectric 112, to the substrate 111. Through the vias 130, 131, 132 and the metal layers 138, 139, the electrode 122 may be electrically wired or connected to electronic circuits with contacts on the substrate 111, the inter-layer dielectric 113, and the inter-layer dielectric 114.

Connections of an electrode with an electronic circuit are shown in FIG. 1 with reference to the connection of the electrode 123 to contacts for one or more transistors 116, 117. The via 133 provides a conductive path through the inter-layer dielectric 114 from the electrode 123, which is formed on the etch stop layer 115, to the metal layer 140, which is formed on the inter-layer dielectric 114. The via 134 provides a conductive path through the inter-layer dielectric 113 from the metal layer 140, which is formed on the inter-layer dielectric 114, to the metal layer 141, which is formed on the inter-layer dielectric 112. The vias 135 provide respective conductive paths through the inter-layer dielectric 112 from the metal layer 141, which is formed on the inter-layer dielectric 112, to the contacts of the one or more transistors 116, 117. Through the vias 133, 134, 135 and the metal layers 140, 141, the electrode 123 may also be electrically wired or connected to electronic circuits with contacts on the inter-layer dielectric 113, and the inter-layer dielectric 114.

Further, the MEMS device 101 has a hinge 152 formed on the electrode 122 directly or on an additional conductive support structure mounted on the electrode 122, where the conductive support as shown in each of the figures by example may be formed of the same material as the electrode 122. The MEMS device 101 has a mirror element 151 formed on the upper side of the hinge 152. In this embodiment and the others described herein, the mirror element is one example of a movable element that may be incorporated into the MEMS device described herein. Meanwhile, a mechanical stopper 153, 154 is formed at the bottom of the hinge 152. The mechanical stopper 153, 154 as shown is a single piece formed of the same material as the hinge 152 that extends in parallel with the default or unexcited position of the mirror element 151, which is in turn in parallel with a mounting surface of the substrate 111 and its layers.

The substrate 111 is composed of single crystal silicon. The transistors 116 and 117 are CMOS transistors in this example, but other electronic circuits are possible. The inter-layer dielectrics 112, 113, 114 are interlayer insulating films or layers including silicon dioxide ($SiO_2$) or another appropriate insulating material.

The metal layers 136, 137, 138, 139, 140, 141 are made of, for example, aluminum (Al), copper (Cu), or an aluminum copper alloy (Al—Cu).

The electrodes 121, 122, 123 are made of tungsten (W) or the same material as the vias. Each of the vias 127, 128, 129, 130, 131, 131, 132, 133, 134, 135 is formed as a through-hole that extends through at least one layer of the MEMS device 101 and is filled with a conductive material, tungsten (W) in this example. In addition, gaps 124, 125, and 126 may be formed between the vias 127, 130, 133 and the etch stop layer 115 during manufacturing that result in problems in the manufacturing method because a subsequently-used etchant may penetrate these gaps and damage the structures, to mitigate this problem, and assuming that the radius of the via 127 is r, it is desirable that the relationship of the distance x over which the electrode 121 covers the etch stop layer 115 is more than twice r. This same relationship between the radius r of a via through an etch stop layer and the length or distance x of an electrode mounted on the etch stop layer is desirable for each electrode mounted on the etch stop layer.

In a structure herein where an electrode, such as the electrode 122, is mounted on the etch stop layer, such as the etch stop layer 115, the relationship is described above as the distance x over which the electrode covers the etch stop layer is more than twice r. In other structures described herein, e.g., FIG. 7, the etch stop layer may instead cover the some or all of the electrode. More generally, the electrode may be described as having a length, a size or a dimension (e.g., a length, a width, or a radius) along the surface upon which it is mounted that is at least twice the radius of the via with which it is electrically connected.

That is, for example, is desirable that the electrodes 121, 122, 123 covering the etch stop layer 115 have a size that is twice or more the radius of the via connected to each. This prevents the vapor etchant from (i) penetrating the electrodes 121, 122, 123 and the etch stop layer 115 and (ii) eroding the inter-layer dielectric 114 through the gaps 123, 125, 126.

The hinge 152 is a deformable member that supports the mirror element 151. The hinge 152 is made of a material such as amorphous silicon or poly-silicon, for example.

The mirror element 151 is a member capable of reflecting light from light sources. The mirror element 151 has a support layer composed of titanium, tungsten, or the like, and a mirror layer composed of a material with good reflectivity, such as aluminum, gold, or silver, or any combination thereof.

The mirror element 151 is electrostatically attracted to the electrode 123, and the hinge 152 tilts due to deformation. This may result from applying a voltage between the movable element (e.g., the mirror element 151) and the electrode 123. The voltage causes the attractive force. As shown in FIG. 2, the mirror element 151 is prevented from contact with the electrode 123, which is not covered with an insulating layer, by contacting the stopper 153. That is, the mechanical stopper 153, 154 is mounted at a height above the electrodes 121, 123 and has a size (e.g., a length) sufficient to prevent deformation of the hinge 152 from causing the mirror element 151 to contact the electrode 123. For example, the length of the mechanical stopper 153, 154 allows contact with the mirror element 151 when the mirror element 151 tilts to prevent the mirror element 151 from contacting another other portion of the MEMS device. Deformation of the hinge 152 is prevented from causing the mirror element 151 to contact the electrode 123. Thus, it is possible to prevent an electrical short circuit. Because the mechanical stopper 153, 154 is formed of the same material as the hinge 152 in this example, it may also deform slightly, but this deformation may be ignored, or may be considered in determining the length and mounting height of the mechanical stopper 153, 154.

Figure 3:
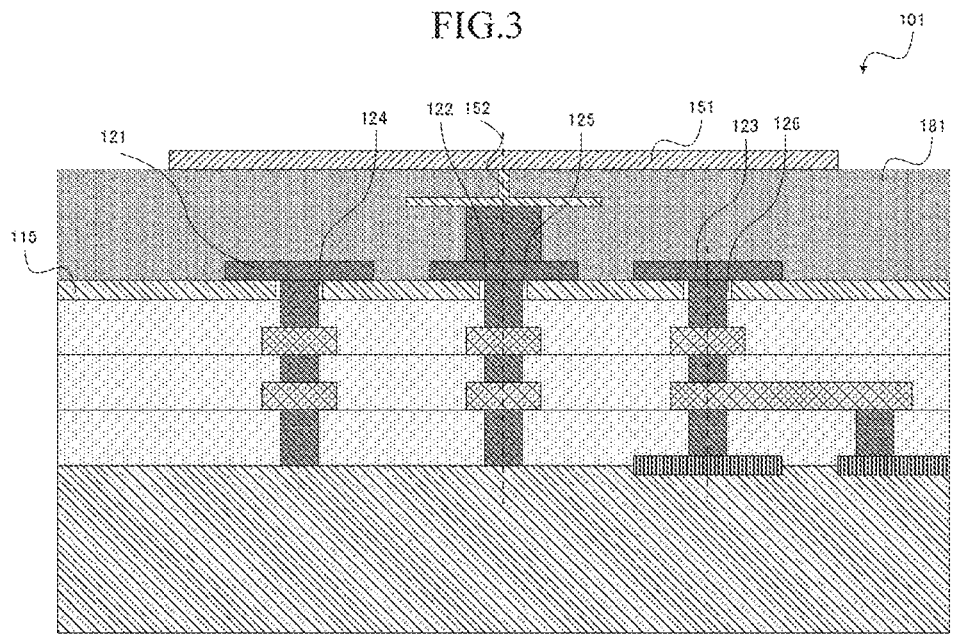
FIG. 3 is a cross-sectional diagram of one mirror element of a MEMS device for describing a production process of FIG. 1.

Referring now to FIG. 3, a sacrificial layer 181 is used to form the mirror element 151. The sacrificial layer 181 is formed of an inorganic or amorphous material, one example of which is $SiO_2$. The sacrificial layer 181 is deposited over the stop etch layer 115 and any components on the surface of the stop etch layer 115. After the mirror element 151 is formed on the surface of the sacrificial layer 181, the sacrificial layer 181 is removed by hydrofluoric acid vapor (Vapor HF), which is a vapor etchant. At that time, the mirror element 151, hinge 152, the electrodes 121, 122, 123, and the etch stop layer 115 are exposed to Vapor HF. However, because each material has resistance to Vapor HF, erosion is insignificant. In addition, the inter-layer dielectrics 112, 113, 114 composed of silicon dioxide ($SiO_2$) are covered by the electrodes 121, 122, 123 and the etch stop layer 115, and therefore are minimally eroded. Also, for example, the electrode 121 covers the etch stop layer 115 with a distance of x that is more than twice the radius of the via 127, and the same feature may be incorporated for the electrodes 122, and 123. Therefore, the distance of x is sufficient to prevent Vapor HF from infiltrating between the etch stop layer 115 and the electrode 121, 122, 123 and reaching the inter-layer dielectrics 112, 113, 114.

Figure 4:
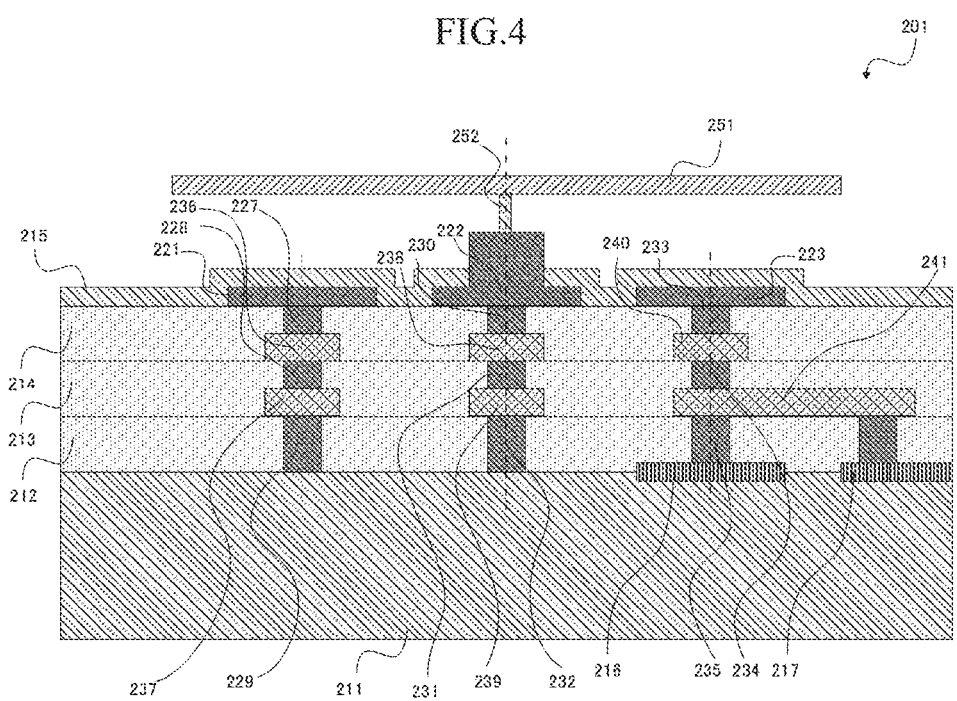
FIG. 4 is a cross-sectional diagram of a MEMS device according to a second embodiment.
Figure 5:
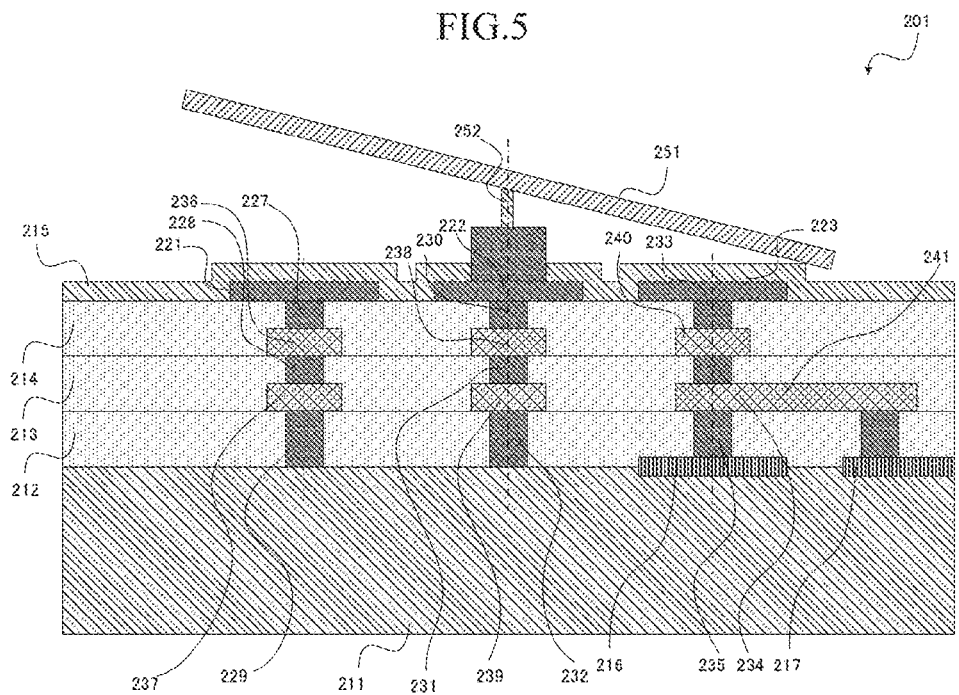
FIG. 5 is a cross-sectional diagram when a mirror of the MEMS device in FIG. 4 is deflected to an ON state.

FIGS. 4 and 5 show a cross-sectional view of a MEMS device 201 in a second embodiment of this disclosure. The MEMS device 201 includes a substrate 211. At least one electronic circuit is formed on the substrate 211, which in this example is one or more transistors 216, 217. Like the transistors 116, 117 of FIGS. 1-3, the transistors 216, 217 may be CMOS transistors, or some other electronic component or circuit. Inter-layer dielectrics 212, 213, 214 are formed on the substrate 211. Namely, the inter-layer dielectric 212 is formed on the substrate 211 and portions of the electronic circuits, here the transistors 216, 217. The inter-layer dielectric 213 is formed on the inter-layer dielectric 212, and the inter-layer dielectric 214 is formed on the inter-layer dielectric 213. More or fewer inter-layer dielectrics may be incorporated, and the inter-layer dielectrics 212, 213, 214 may be formed of the same material as the inter-layer dielectrics 112, 113, 114. An etch stop layer 215 formed on the (e.g., top) inter-layer dielectric 214 that is layered furthest from the substrate.

Further, the MEMS device 201 has metal layers 236, 237, 238, 239, 240, 241 and electrodes 221, 222, 223 for electrical wiring between the inter-layer dielectrics 212, 213, 214. Also, the MEMS device 201 has vias 227, 228, 229, 230, 231, 232, 233, 234, 235 connecting electrical wirings and electrodes. The vias 227, 228, 229, the metal layers 236, 237, and the electrode 221 may be formed in the same arrangements and of the same materials as the vias 127, 128, 129, the metal layers 136, 137, and the electrode 121 respectively, as described above. The vias 230, 231, 232, the metal layers 238, 239, and the electrode 222 may be formed in the same arrangements and of the same materials as the vias 130, 131, 132, the metal layers 138, 139, and the electrode 122, respectively, as described above. The vias 233, 234, 235, the metal layers 240, 241, and the electrode 223 may be formed in the same arrangements and of the same materials as the vias 133, 134, 135, the metal layers 140, 141, and the electrode 123, respectively, as described above.

The MEMS device 201 has a hinge 252 formed on the electrode 222 directly or on a separate electrode mounted on the electrode 122, and a mirror element 251 formed on the upper side of the hinge 252. The hinge 252 may be formed in the same way and using the same material as the hinge 152, and the mirror element 251 may be the same as the mirror element 151 described above.

The electrodes 221, 222, 223 are made of Al, an Al—Cu alloy, or the like. The electrodes 221, 222, 223 are formed on the inter-layer dielectric 214. The electrodes 221, 222, 223 form a step with the inter-layer dielectric 214. In contrast to the arrangement of FIGS. 1-3 wherein the etch stop layer 115 covers the inter-layer dielectric 114, and the electrodes 121, 122, 123 are formed on the etch stop layer 115, in this embodiment the etch stop layer 215 has a stepped structure to cover the electrodes 221, 222, 223 and the inter-layer dielectric 214.

A major difference between the second embodiment and the first embodiment is that the etch stop layer 215 covers the electrodes 221, 222, 223. In addition, the mechanical stoppers 153, 154 in FIG. 1 are not formed in the embodiment in FIG. 4.

The mirror element 251 is electrostatically attracted to the electrode 223 and the hinge 252 tilts due to deformation. As can be seen in FIG. 5, the mirror element 251 is restricted in inclination by contacting the etch stop layer 215 that overlays the electrode 223. The etch stop layer 215 also prevents the mirror element 251 from directly contacting the electrode 223. Because the etch stop layer 215 is an insulating film composed of Aluminum nitride (AlN) or Aluminum oxide ($Al_2O_3$), an electrical short circuit can be prevented.

Figure 6:
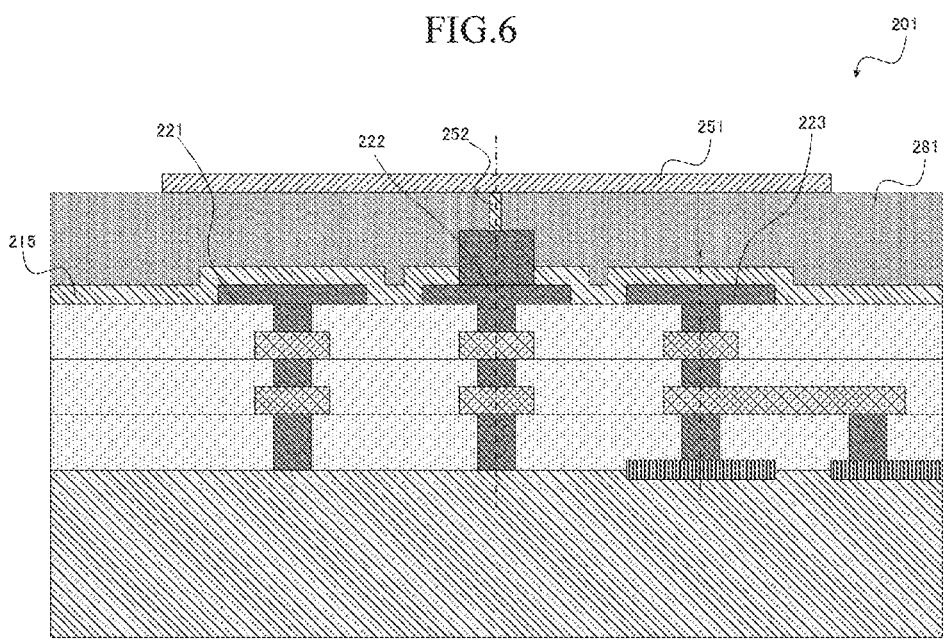
FIG. 6 is a cross-sectional diagram of one mirror of a MEMS device for describing a production process of FIG. 4.

FIG. 6 is a cross-sectional view of the sacrificial layer 281 for forming the mirror element 251. The sacrificial layer 281 is formed of an inorganic or amorphous material such as $SiO_2$, and is deposited over the stop etch layer 215 and any components extending from the surface of the stop etch layer 215. The sacrificial layer 281 is removed by hydrofluoric acid vapor (Vapor HF), which is a vapor etchant, after the mirror element 251 is formed. At that time, the mirror element 251, the hinge 252, the electrode 222, and the etch stop layer 215 are exposed to Vapor HF. However, because each material has resistance to Vapor HF, they are minimally eroded.

Figure 7:
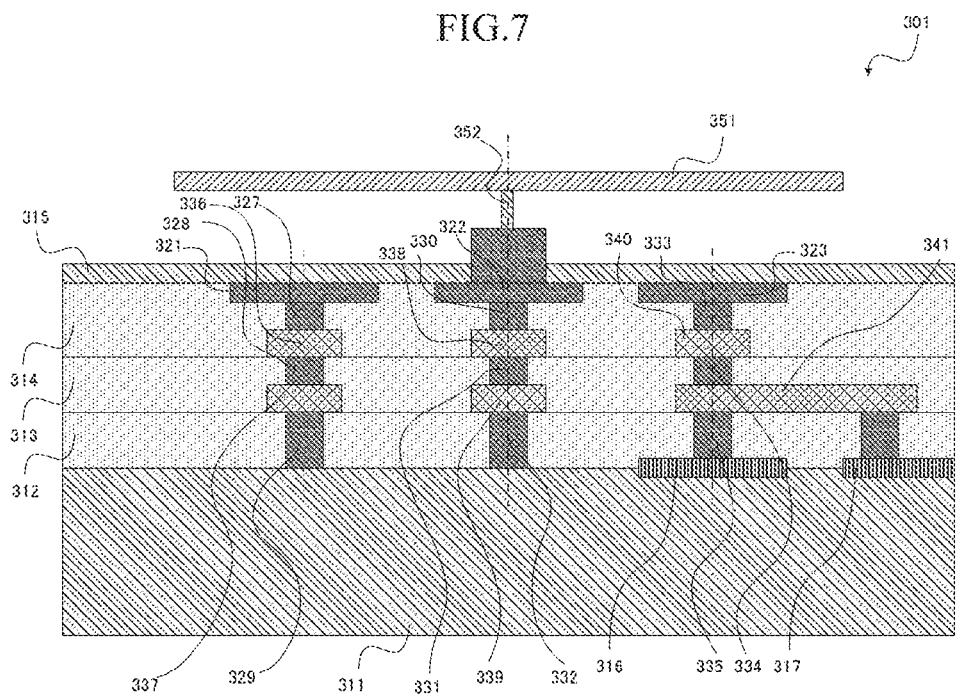
FIG. 7 is a cross-sectional diagram of a MEMS device according to a third embodiment.

FIG. 7 is a cross-sectional view of a MEMS device 301 according to a third embodiment of this disclosure. The MEMS device 301 comprises a substrate 311, transistors 316, 317 which are examples of electronic circuits that may be formed in the MEMS device 301, inter-layer dielectrics 312, 313, 314 formed on the substrate 311, and an etch stop layer 315 formed on the inter-layer dielectric 314.

The MEMS device 301 has metal layers 336, 337, 338, 339, 340, 341 and electrodes 321, 322, 323 for electrical wiring between the inter-layer dielectrics 312, 313, 314. Also, the MEMS device 301 has vias 327, 328, 329, 330, 331, 332, 333, 334, 335 connecting electrical wirings and electrodes. The substrate 311, the transistors 316, 317, the metal layers 336, 337, 338, 339, 340, 341, and the vias 327, 328, 329, 330, 331, 332, 333, 334, 335 have compositions and arrangements similar to the substrate 111, the transistors 116, 117, the metal layers 136, 137, 138, 139, 140, 141, and the vias 127, 128, 129, 130, 131, 131, 132, 133, 134, 135, respectively, so duplicative descriptions are omitted. The inter-layer dielectrics 312, 313, 314 may be formed of the same material as the inter-layer dielectrics 112, 113, 114, and provide the same insulating function for the transistors 316, 317, the metal layers 336, 337, 338, 339, 340, 341, and the vias 327, 328, 329, 330, 331, 331, 332, 333, 334, 335, as the inter-layer dielectrics 112, 113, 114 provide for the transistors 116, 117, the metal layers 136, 137, 138, 139, 140, 141, and the vias 127, 128, 129, 130, 131, 132, 133, 134, 135. However, the arrangement of the inter-layer dielectric 314 with the electrodes 321, 322, 323 is different from the previous embodiments as described in further detail below.

Further, the MEMS device 301 has a hinge 352 formed on the electrode 322, and a mirror element 351 formed on the upper side of the hinge 352. The hinge 352 may be formed in the same way and using the same material as the hinge 251, and the mirror element 351 may be the same as the mirror element 251 described above.

The electrodes 321, 322, 323 are composed of Copper (Cu), tungsten (W), or the like. The electrodes 321, 322, 323 may be formed by a damascene process so as to be buried in the inter-layer dielectric 314. The damascene process is described below with regards to FIG. 12. As can be seen from that description, the electrodes 321, 322, 323 and the inter-layer dielectric 314 are simultaneously subjected to chemical mechanical polishing (CMP), they are aligned on the same surface. The etch stop layer 315 is formed on the electrodes 321, 322, 323 and the inter-layer dielectric 314, and is planarized on the same surface. Because of its manufacturing method, the etch stop layer 315 has no step structure and can form a uniform and defect-free film. Therefore, even when the etch stop layer 315 is thinly formed, erosion of the inter-layer dielectric 314 by Vapor HF can be prevented.

Figure 8:
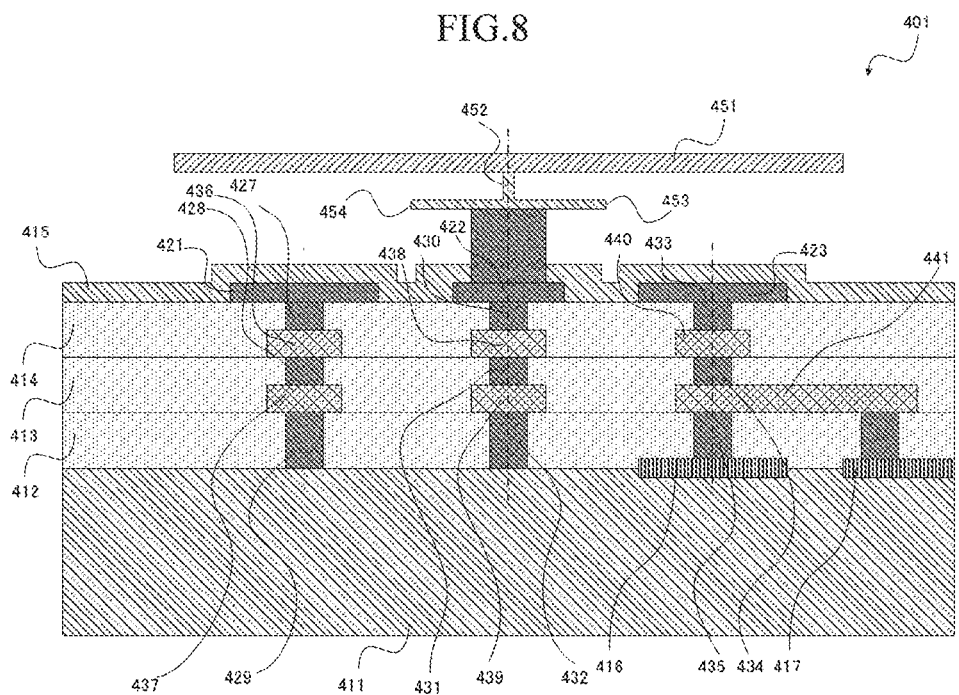
FIG. 8 is a cross-sectional diagram of a MEMS device according to a fourth embodiment.
Figure 9:
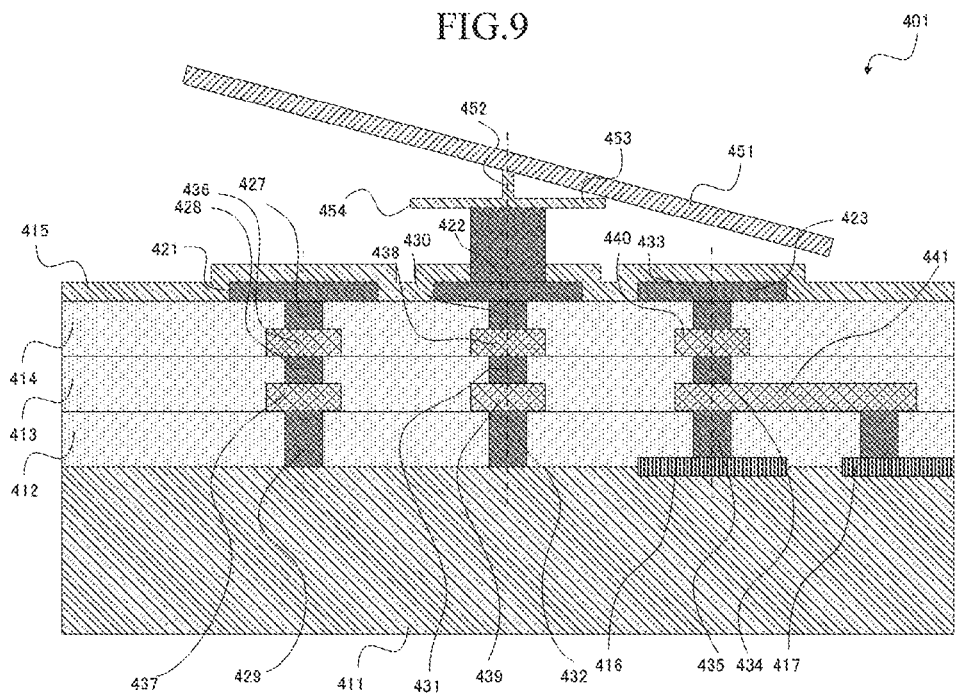
FIG. 9 is a cross-sectional diagram when a mirror of the MEMS device in FIG. 7 is deflected to an ON state.

FIGS. 8 and 9 show a cross-sectional diagram of a MEMS device 401 according to a fourth embodiment of this disclosure. The MEMS device 401 includes a substrate 411. At least one electronic circuit is formed on the substrate 411, which in this example is one or more transistors 416, 417. Like the transistors 116, 117 of FIGS. 1-3, the transistors 416, 417 may be CMOS transistors, or some other electronic component or circuit, inter-layer dielectrics 412, 413, 414 are formed on the substrate 411. Namely, the inter-layer dielectric 412 is formed on the substrate 411 and portions of the electronic circuits, here the transistors 416, 417. The inter-layer dielectric 413 is formed on the inter-layer dielectric 412, and the inter-layer dielectric 414 is formed on the inter-layer dielectric 413. More or fewer inter-layer dielectrics may be incorporated, and the inter-layer dielectrics 412, 413, 414 may be formed of the same material as the inter-layer dielectrics 112, 113, 114.

The MEMS device 401 has metal layers 436, 437, 438, 439, 440, 441 and electrodes 421, 422, 423 for electrical wiring between the inter-layer dielectrics 412, 413, 414. Also, the MEMS device 401 has vias 427, 428, 429, 430, 431, 432, 433, 434, 435 connecting electrical wirings and electrodes. The vias 427, 428, 429, the metal layers 436, 437, and the electrode 421 may be formed in the same arrangements and of the same materials as the vias 127, 128, 129, the metal layers 136, 137, and the electrode 121 respectively, as described with respect to the first embodiment. The vias 430, 431, 432, the metal layers 438, 439, and the electrode 422 may be formed in the same arrangements and of the same materials as the vias 130, 131, 132, the metal layers 138, 139, and the electrode 122, respectively, as described with respect to the first embodiment. The vias 433, 434, 435, the metal layers 440, 441, and the electrode 423 may be formed in the same arrangements and of the same materials as the vias 133, 134, 135, the metal layers 140, 141, and the electrode 123, respectively, as described with respect to the first embodiment. Unlike the first embodiment and like the second embodiment, however, the electrodes 421, 422, 423 form a step with the (i.e., top) inter-layer dielectric 414 that is layered furthest from the substrate 411, and an etch stop layer 415 has a stepped structure to cover the electrodes 421, 422, 423 and the inter-layer dielectric 414. The etch stop layer 415 may be an insulating film composed of AlN or $Al_2O_3$.

The MEMS device 401 has a hinge 452 formed on the electrode 422 directly or on a separate electrode mounted on the electrode 422, and a mirror element 451 formed on the upper side of the hinge 452. The hinge 452 may be formed in the same way and using the same material as the hinge 152, and the mirror element 451 may be the same as the mirror element 151 described with respect to the first embodiment. At the bottom of the hinge 452, mechanical stoppers 453, 454 are formed that are similar to the stoppers 153, 154 of the first embodiment.

The major difference between the fourth embodiment and the second embodiment is that the bottom of the hinge 452 is formed with the mechanical stoppers 453, 454.

Referring to FIG. 9, the mirror element 451 is electrostatically attracted to the electrode 423, and deformation of the hinge 452 causes the hinge 452 to tilt. By touching the stopper 453, the mirror element 451 can prevent contact with the etch stop layer 415 overlaid on the electrode 423. Therefore, it is possible to prevent the mirror element 451 from sticking to the etch stop layer 415, in addition to preventing an electrical short circuit.

Figure 10:
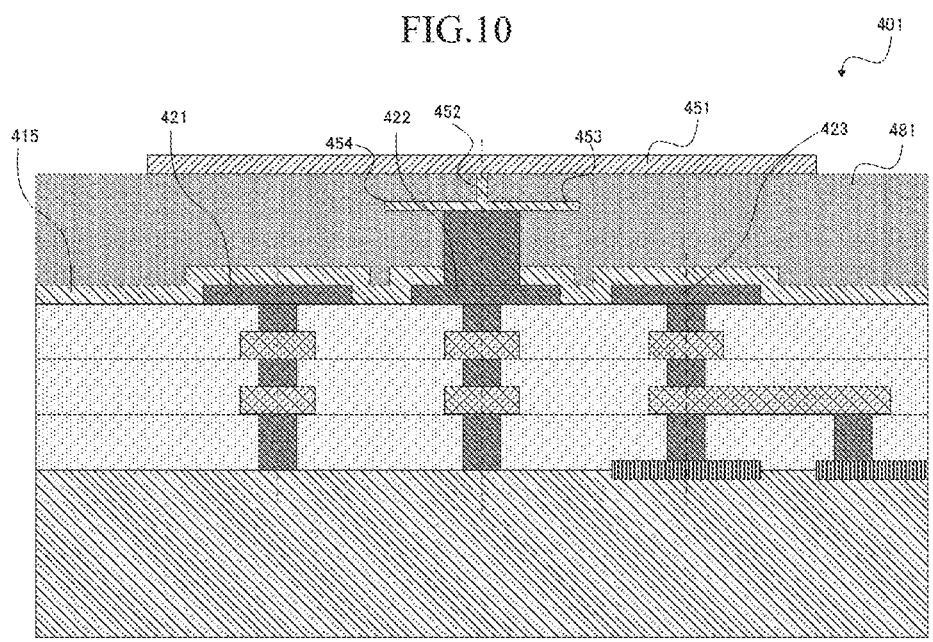
FIG. 10 is a cross-sectional diagram of one mirror of a MEMS device for describing a production process of FIG. 8.

FIG. 10 is a cross-sectional diagram of one mirror element of a mirror device for describing a production process of FIG. 8. A sacrificial layer 481 is a base for forming the mirror element 451. The sacrificial layer 481 is formed of an inorganic or amorphous material such as $SiO_2$, and is deposited over the stop etch layer 415 and any components extending from the surface of the stop etch layer 415. The sacrificial layer 481 is removed by hydrofluoric acid vapor (Vapor HF), which is a vapor etchant, after the mirror element 451 is formed. At that time, the mirror element 451, the hinge 452, the electrode 422, and the etch stop layer 415 are exposed to Vapor HF. However, because each material has resistance to Vapor HF, they are minimally eroded.

A method for manufacturing a MEMS device on a substrate is next described. For ease of explanation, reference numbers corresponding to the first embodiment are used. However, the method for manufacturing the other embodiments is similar. In the method, an electronic circuit is form on the substrate 111. In the example of FIGS. 1-3, the electronic circuit comprises a transistor 116, a transistor 117, or some other electronic circuit coupled to any one or more of the metal layers 136, 137, 138, 139, 140, 141. An insulating layer (also referred to as an inter-layer dielectric herein) 112 is also formed on the substrate 111. A via, such as the via 132, comprising a through-hole extending through the insulating layer 112 and filled with an electrically-conductive material, is formed. The via 132 electrically connects with the electronic circuit. An electrode, such as the electrode 122, is formed on the insulating layer 112, and the electrode 112 is electrically connected to the via 132.

As can be seen, more than one insulating layer or interlayer dielectric 112, 113, 114 may be formed. Accordingly, and depending upon the electronic circuits arranged on the substrate 111, one or more metal layers may be deposited on respective insulating layers 112, 113, 114, and one or more vias extending through the insulating layers 112, 113, 114 may be formed to electrically connect an electrode to an electronic circuit. For example, the electrode 112 may be electrically connected to the via 132 through the metal layer 139, the via 131, the metal layer 138, and the via 130.

Figure 11:
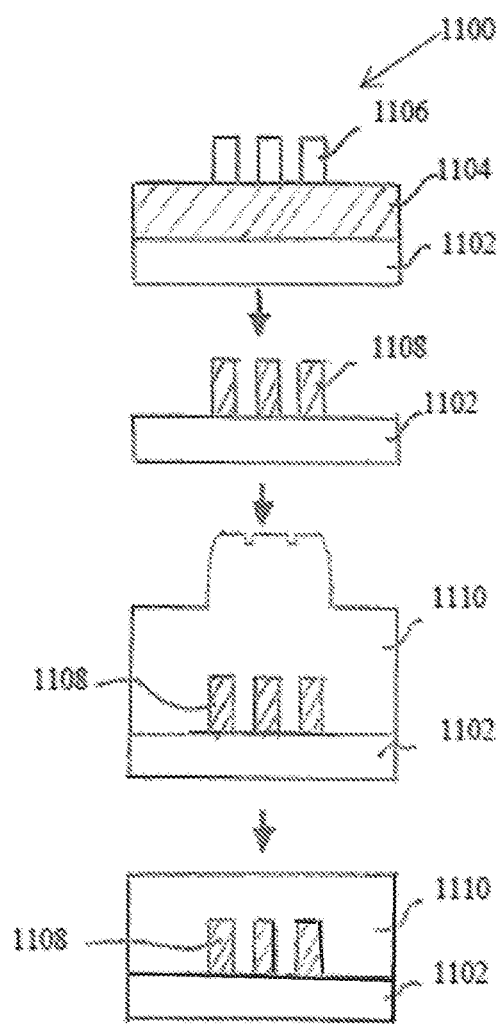
FIG. 11 is an example of a metallization process.

The formation of electrodes, vias, and metal layers herein may be performed using a metallization process 1100 where, for example, the metal is one that can be easily etched, such as Al or the like. An example of a metallization process 1100 is shown in FIG. 11. In FIG. 11, a metal layer 1104 is deposited on a dielectric layer 1102. The dielectric layer 1102 may be located on a wafer, such as an Si wafer. A photoresist 1106 is applied in a positive pattern that protects portions of the metal layer 1104. Then, the metal layer 1104 is etched using an etchant according to the pattern of the photoresist 1106 leaving metal portions 1108 that may correspond to the electrodes, vias, or metal layers referred to herein. Dielectric 1110 is deposited on the dielectric layer 1102 and the metal portions 1108. Finally, the excess dielectric is etched. For example, the dielectric 1110 is planarized by Chemical Mechanical Planarization (CMP). Because the metal layer 1104 is etched in this process 1100, it may be referred to as a subtractive process.

Figure 12:
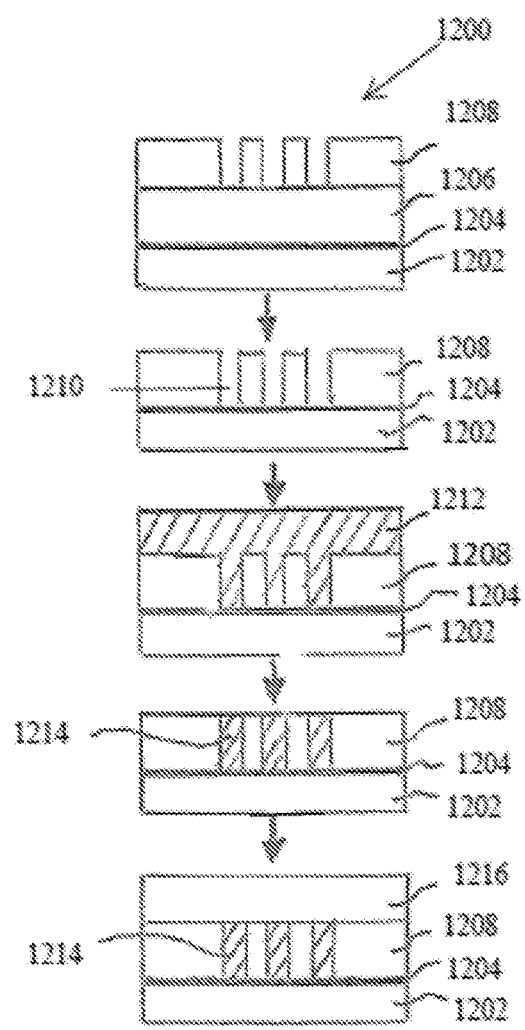
FIG. 12 is an example of a damascene process.

When an electrode, via, or metal layer is instead composed of Cu, W, or the like, that are more resistant to etching a damascene process 1200 such as shown in FIG. 12 may be used for metallization. In such a process 1200, an etch stop 1204 is deposited on a dielectric layer 1202. The dielectric layer 1202 may be located on a wafer, such as an Si wafer. The material of the etch stop 1204 may differ depending on the metal material to be used. Another dielectric layer 1206 is formed on the etch stop 1204. A photoresist 1208 is applied in a negative pattern that protects portions of the dielectric layer 1206. Then, the dielectric layer 1206 is etched using an etchant according to the pattern of the photoresist 1208 leaving trenches or holes 1210 for electrodes, vias, lines, or metal layers referred to herein. Metal 1212 is deposited on the remaining dielectric layer 1206 and exposed etch stop 1204 to fill the trenches or holes 1210. For example, Cu may be deposited by electroplating. Thereafter, the excess metal 1212 is removed by CMP to form metal portions 1214 that may correspond to the electrodes, vias, or metal layers referred to herein. A dielectric layer 1216 is deposited over the metal portions 1214 and the remaining dielectric layer 1206. Because the process 1200 etches trenches or holes 1210 for the addition of metal 1212, it may be referred to as an additive process.

Instead of the single damascene process described above, a dual damascene process may be used. In a dual damascene process, vias and lines (also referred to as electrodes or metal lines herein) may be formed by etching holes and trenches in the dielectric layer, and then metal is deposited in both features so formed. One photoresist and etch step pair may be used to make holes in the dielectric to make connection with an underlying metal, and another photoresist and etch step pair may make trenches for metal lines. The two photoresist and etch steps may be performed in one of two orders—trench first, then make the holes, or makes holes first, then trench—before depositing the metal.

Regardless of how many insulating layers are included and what process is used for metallization, an etch stop layer 115 may be formed on the outermost insulating layer, inter-layer dielectric 11. The etch stop layer 115 may be made of at least one of Aluminum nitride (AlN) or Aluminum oxide ($Al_2O_3$). Forming the etch stop layer 115 may include sputtering Aluminum oxide on the insulting layer 114 under a proper oxygen partial pressure. The sputtered Aluminum oxide may form a film. Forming the etch stop layer 115 may include forming a film on the insulating layer 114 made of Aluminum oxide using atomic layer deposition.

Next, a vertical hinge 152 is formed. That is, the vertical hinge 152 is a hinge that extends perpendicular to a mounting surface of the substrate, such as the substrate 111. The vertical hinge 152 is connected to the electrode 122. A sacrificial layer 181 made of an inorganic or amorphous material is formed on the insulating layer 114, and may be formed on the etch stop layer depending upon the arrangement of the insulating layer 114, the electrodes, and the etch stop layer. A movable element, such as the mirror or mirror element 151, is formed on the hinge 152. The formation of a vertical hinge 152 and a mirror element 151 may performed using any number of techniques. Additional details of one example technique is described in U.S. Pat. No. 7,876,488, the entire content of which is incorporated herein by reference. Subsequently, the sacrificial layer 181 is removed by hydrofluoric acid vapor.

Although the present invention has been described in terms of certain embodiments, it is to be understood that such disclosure is not to be interpreted as limiting. Various alterations and modifications will become apparent to those skilled in the art after reading the disclosure. Accordingly, it is intended that the appended claims be interpreted as covering all alternations and modifications that fall within the scope thereof.

What is claimed is:

1. A Micro-Electro-Mechanical Systems (MEMS) device, comprising:
   a substrate;
   an electronic circuit on the substrate;
   a first electrode electrically connected to the electronic circuit;
   a second electrode electrically connected to the electronic circuit;
   a movable element that is controlled by applying a voltage between the first electrode and the movable element, wherein the movable element is supported by a conductive support that is mounted to the second electrode, and wherein the conductive support is formed of the same material as the second electrode;
   an insulating layer disposed at least partially between the first electrode and the electronic circuit, wherein an upper surface of the insulating layer is coplanar with an upper surface of the first electrode, and the insulating layer includes a via electrically connecting the first electrode and the electronic circuit; and
   an etch stop layer on the insulating layer, wherein the etch stop layer is made of at least one of Aluminum nitride or Aluminum oxide, the etch stop layer is between the movable element and the first electrode, and the etch stop layer is planarized on the upper surface of the insulating layer and the upper surface of the first electrode.

2. The MEMS device of claim 1, wherein the etch stop layer comprises a uniform film.

3. The MEMS device of claim 2, wherein the upper surface of the insulating layer is coplanar with an upper surface of the second electrode, and wherein the conductive support extends through the etch stop layer and projects above the upper surface of the insulating layer and above an upper surface of the etch stop layer.

4. The MEMS device of claim 1, wherein the etch stop layer is sputtered Aluminum oxide.

5. The MEMS device of claim 1, wherein the etch stop layer is a film made of Aluminum oxide formed by atomic layer deposition.

6. The MEMS device of claim 1, wherein the first electrode is connected to the via, and the via includes tungsten.

7. The MEMS device of claim 1, wherein the first electrode has a dimension along a surface upon which it is mounted that is at least twice a radius of the via with which it is electrically connected.

8. The MEMS device of claim 1, wherein the movable element is a mirror with a vertical hinge that is perpendicular to a mounting surface of the substrate.

9. The MEMS device of claim 8, further comprising:
a stopper with the vertical hinge, the stopper extending in parallel with a mounting surface of the substrate, and wherein the stopper has a size sufficient to contact the mirror when the mirror tilts to prevent the mirror from contacting any other portion of the MEMS device.

10. The MEMS device of claim 1, wherein the etch stop layer is free of a step structure.

11. The MEMS device of claim 10, wherein the etch stop layer is a uniform and planar surface.

12. A method for manufacturing a Micro-Electro-Mechanical Systems (MEMS) device on a substrate, the method comprising:
forming an electronic circuit on the substrate;
forming an insulating layer on the substrate;
forming a via comprising a through-hole extending through the insulating layer and filled with an electrically-conductive material that is electrically connected to the electronic circuit;
forming a first electrode connected to the via on the insulating layer, wherein an upper surface of the first electrode is aligned with an upper surface of the insulating layer;
forming a second electrode on the insulating layer, wherein an upper surface of the second electrode is aligned with the upper surface of the insulating layer;
forming an etch stop layer on the insulating layer, the etch stop layer made of at least one of Aluminum nitride or Aluminum oxide;
forming a vertical hinge connected to the second electrode, wherein the vertical hinge is connected to the second electrode by a conductive support that is mounted to the second electrode and extends beyond the upper surface of the insulating layer and an upper surface of the etch stop layer, and wherein the conductive support is formed of the same material as the second electrode;
forming a sacrificial layer on the insulating layer;
forming a movable element connected to the vertical hinge; and
removing the sacrificial layer by hydrofluoric acid vapor, wherein the etch stop layer is formed after forming the first electrode such that the etch stop layer is between the movable element and the first electrode, and the etch stop layer is planarized on the upper surface of the insulating layer and the upper surface of the first electrode.

13. The method of claim 12, wherein the etch stop layer comprises a uniform film.

14. The method of claim 13, wherein the first electrode is formed using a damascene process.

15. The method of claim 13, wherein forming the etch stop layer comprises sputtering Aluminum oxide on the insulating layer.

16. The method of claim 13, wherein forming the etch stop layer comprises forming a film on the insulating layer made of Aluminum oxide using atomic layer deposition.

17. The method of claim 12, wherein a dimension over which the first electrode extends along its mounting surface is more than twice a radius of the via.

18. The method of claim 12, wherein forming the via comprises forming the via using a damascene process.

19. The method of claim 12, wherein the first electrode has a dimension along a surface upon which it is mounted that is at least twice a radius of the via with which it is electrically connected.

20. The method of claim 12, wherein the movable element is a mirror with a vertical hinge that is perpendicular to a mounting surface of the substrate.

* * * * *